United States Patent
Thomas

(10) Patent No.: US 6,509,283 B1
(45) Date of Patent: *Jan. 21, 2003

(54) THERMAL OXIDATION METHOD UTILIZING ATOMIC OXYGEN TO REDUCE DANGLING BONDS IN SILICON DIOXIDE GROWN ON SILICON

(75) Inventor: Michael E. Thomas, Milpitas, CA (US)

(73) Assignee: National Semiconductor Corporation, Santa Clara, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/076,960

(22) Filed: May 13, 1998

(51) Int. Cl.$^7$ .................... H01L 21/31; H01L 21/469
(52) U.S. Cl. .................... 438/787; 438/765; 438/770; 438/778; 438/788; 438/624
(58) Field of Search ................ 438/439, 765, 438/778, 787, 788, 624, 762, 769, 770

(56) References Cited

U.S. PATENT DOCUMENTS

| | | | | |
|---|---|---|---|---|
| 4,409,260 A | * | 10/1983 | Pastor et al. | 427/82 |
| 4,416,952 A | * | 11/1983 | Nishizawa et al. | 428/698 |
| 4,509,451 A | * | 4/1985 | Collins et al. | 118/50.1 |
| 4,902,647 A | * | 2/1990 | Chutjian et al. | 438/769 |
| 5,198,392 A | * | 3/1993 | Fukuda et al. | 438/769 |
| 5,693,578 A | * | 12/1997 | Nakanishi et al. | 438/769 |
| 5,738,909 A | * | 4/1998 | Thakur et al. | 427/255.4 |
| 5,869,405 A | * | 2/1999 | Gonzalez et al. | 438/770 |
| 5,926,741 A | * | 7/1999 | Matsuoka et al. | 438/778 |

OTHER PUBLICATIONS

Wong et al. "Preoxidation Treatment Using HCl/HF Vapor", IEEE, pp. 425–426, Aug. 1991.*

Ericsson et al. "Oxygen Partial Pressure Influence on Internal Oxidation of SIMOx Wafers". IEEE, pp. 48–49, Oct. 1997.*

James Osborne et al.; Atomic Oxygen Sensor; Department of Aeronautics and Astronautics, University of Southampton; Jul. 11, 1996.

Experiment 5.08: Kinetics of Atomic Oxygen Reactions by a Flow Method; updated May 5, 1996.

Dr. Timothy K. Minton; Development and Characterization of a Novel O–Atom Source for Material Processing; Department of Chemistry & Biochemistry, Montana State University; last updated Apr. 21, 1996.

W.C. Neely et al.; Production of Ground State Atomic Oxygen in a Multifactor Stress Environment; Auburn University Space Power Institute, Auburn University.

Atomic Oxygen; Space Systems Environment Analysis Section; last modified Sep. 25, 1996.

Atomic Oxygen Beam Facility; Electro–Physics Branch, NASA Lewis Research Center, Cleveland, Ohio; last modified Dec. 14, 1994.

* cited by examiner

*Primary Examiner*—Amir Zarabian
*Assistant Examiner*—Maria Guerrero
(74) *Attorney, Agent, or Firm*—Stallman & Pollock LLP

(57) ABSTRACT

Atomic oxygen, or a mixture of atomic oxygen and atomic nitrogen, is utilized in thermally oxidizing silicon to form a layer of silicon dioxide, or nitrogen-doped silicon dioxide, on a surface of the silicon. Use of atomic oxygen (or $O^-+N^-$) provides a better stoichiometric silicon dioxide structure with fewer dangling bonds than results from standard oxidation processes. The atomic oxygen (or $O^-+N^-$) may be generated within the oxidation furnace, for example by passing the gas through a heated ceramic material (e.g., $Al_2O_3$) or by using internal UV radiation of the oxygen gas. Alternatively, the atomic oxygen (or $O^-+N^-$) may be generated at a remote source, for example in a plasma reactor, and then introduced to the oxidation furnace. Atomic chlorine can be generated and used prior to the oxidation step for pre-cleaning the silicon surface.

14 Claims, 2 Drawing Sheets

THERMAL OXIDATION METHOD UTILIZING ATOMIC OXYGEN TO REDUCE DANGLING BONDS IN SILICON DIOXIDE GROWN ON SILICON

BACKGROUND OF THE INVENTION

1. Field of the Invention

The present invention relates to the manufacture of integrated circuit devices and, in particular, to utilization of atomic oxygen to provide a better stoichiometric silicon dioxide structure with fewer dangling bonds than results from oxidation processes currently used in integrated circuit fabrication. Addition of atomic nitrogen to the oxidation process results in an improved nitrogen-doped thermal oxide.

2. Description of the Related Art

FIG. 1 shows a conventional MOS transistor structure that includes spaced-apart source/drain (S/D) regions 10 of one conductivity type (e.g., n-type) formed in semiconductor material 12, typically silicon, having a conductivity type (e.g., p-type) opposite that of the source/drain regions 10. The spaced-apart source/drain regions 10 define a channel region 14 therebetween. A conductive gate region 16, typically polysilicon, overlies the channel region 14 and is separated therefrom by a gate dielectric layer 18, illustrated in FIG. 1 as silicon dioxide about 40–50 Å thick.

FIG. 1 shows the normal molecular structure of the gate silicon dioxide 18 as consisting of four oxygen atoms bonded to a silicon atom, each oxygen atom being shared by four adjacent silicon atoms. However, as further shown in FIG. 1, due to the imperfect nature of current semiconductor integrated circuit fabrication techniques, silicon dioxide formed in accordance with these conventional techniques contains "dangling" silicon bonds, represented by the "x" in the silicon dioxide structure shown in FIG. 1. That is, sites exist within the silicon dioxide structure 18 where an oxygen atom should be present, bound to four adjacent silicon atoms, but is not. These stoichiometric imperfections in the silicon dioxide material 18 can cause performance deficiencies in the resulting integrated circuit device.

It would, therefore, be highly desirable to have available a technique for forming a better stoichiometric silicon dioxide structure with less dangling bonds than results from currently available techniques for forming silicon dioxide.

SUMMARY OF THE INVENTION

The present invention provides a method that utilizes atomic oxygen in a fast ramp furnace to generate a more thorough silicon oxidation process. By placing a large surface area of a metal-oxide, ceramic material, e.g., aluminum oxide ($Al_2O_3$), into the fast ramp furnace and heating it with the silicon wafers in Argon during the ramp cycle, the reactor can be brought to temperature without any oxidation occurring. Oxygen is then passed through the heated ceramic to generate atomic oxygen, which, as is well known, is more highly reactive than molecular oxygen. This more reactive oxygen provides a better stoichiometric gate oxide with less dangling bonds than standard oxidation processes. As a variant of this process, atomic chlorine can be generated in a similar manner as a silicon pre-clean step prior to introduction of the oxygen gas into the reactor. As a further variant, molecular oxygen and molecular nitrogen can both be dissociated to atomic form to provide nitrogen-doped thermal oxide.

In an alternative embodiment of the invention, the atomic oxygen is generated at a remote source, e.g., as an oxygen plasma, and then introduced to the furnace chamber containing the silicon to be thermally oxidized. UV radiation can also be utilized to generate the atomic oxygen, but the silicon structure to be oxidized must be maintained remote from and protected from the UV source, either within or exterior to the oxidation furnace. Atomic nitrogen can be remotely generated for thermal reaction together with atomic oxygen to form nitrogen-doped silicon dioxide.

A better understanding of the features and advantages of the present invention will be obtained by reference to the following detailed description and the accompanying drawings which set forth illustrative embodiments in which the principles of the invention are utilized.

DETAILED DESCRIPTION OF THE INVENTION

In accordance with a first embodiment of the present invention, a silicon substrate and a ceramic material, such as $Al_2O_3$, $ZrO_2$ or $Y_2O_3$, are placed in a furnace. While any conventional furnace currently used for oxidizing silicon is suitable, a "fast ramp furnace" or rapid thermal processing (RTP) chamber is preferred. An inert gas, for example Argon, is then introduced into the furnace. The furnace is then pre-heated so that the silicon substrate is heated to a first temperature, for example 500° C., in the presence of the inert gas. The presence of the inert gas substantially inhibits oxidation of the silicon substrate during the pre-heating step. Atomic oxygen is then generated within the furnace by passing oxygen gas through the ceramic material. Optionally, a mixture of oxygen and nitrogen gas can be passed through the ceramic to generate atomic oxygen and atomic nitrogen. Simultaneously with the introduction of the oxygen gas, the ceramic material is heated to a second temperature, for example 1000° C., that is greater than the first temperature. The passing of the oxygen gas through the heated ceramic material generates atomic oxygen that then reacts with the silicon substrate to form a layer of silicon dioxide on the surface of the silicon substrate. If an oxygen/nitrogen mixture is used, then nitrogen-doped thermal oxide results.

Figure 1:
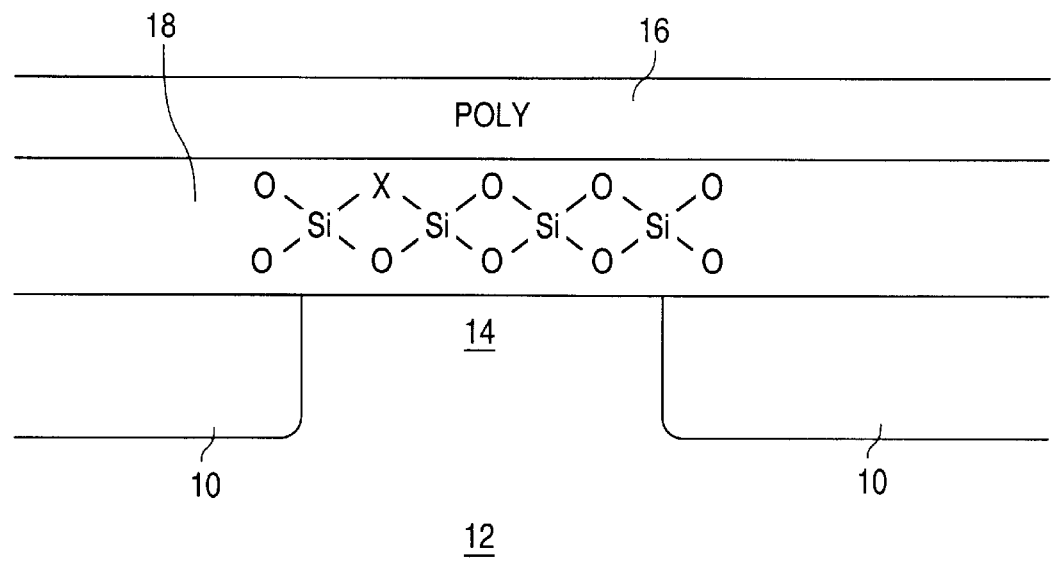
FIG. 1 is a partial cross-sectional drawing illustrating a conventional MOS transistor structure.
Figure 2:
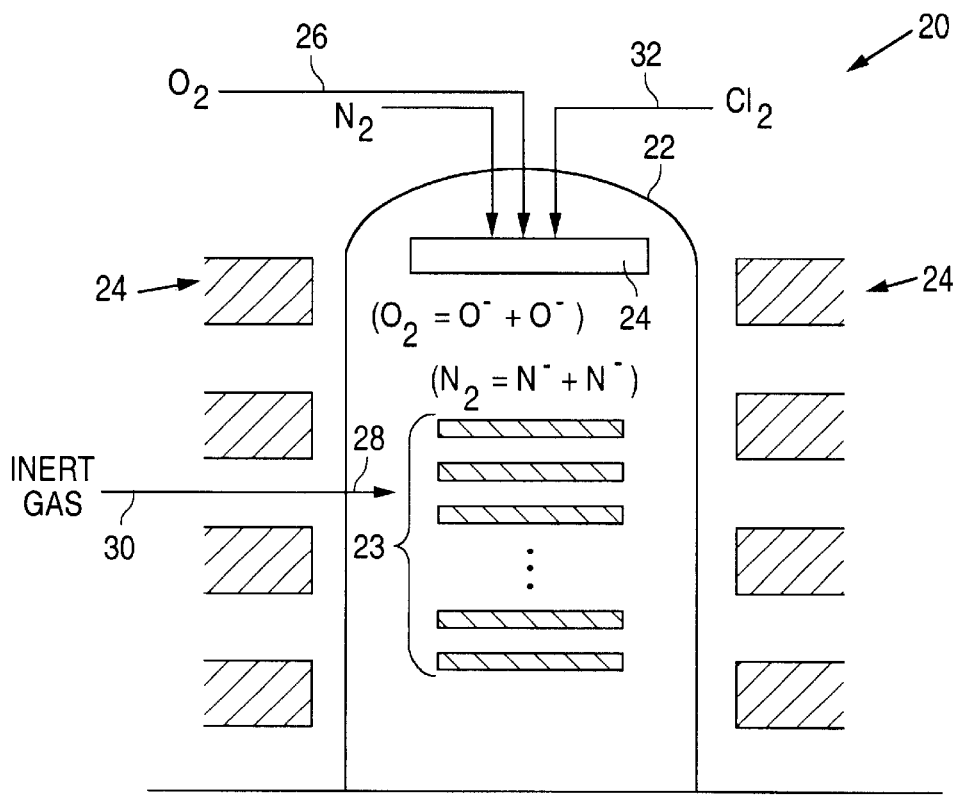
FIG. 2 is a schematic representation illustrating a furnace utilizable in practicing a method in accordance with an embodiment of the present invention.

FIG. 2 shows a fast ramp furnace 20 of the type utilizable in practicing the invention. As is well known to those skilled in the art, a "fast ramp furnace" is defined by the feature of providing a heating rate of 100° C. per minute or greater.

As shown in FIG. 2, the fast ramp furnace includes a reactor vessel 22 and controlled heating elements 24. The reactor vessel 22 of the fast ramp furnace is adapted to hold one or more, and potentially up to two hundred silicon wafers 23. As stated above, ceramic material 24, preferably $Al_2O_3$, is positioned within the reactor vessel 22 such that $O_2$ gas 26 introduced into the vessel 22 passes through the heated ceramic material 24. As shown in FIG. 2, nitrogen ($N_2$) gas may also be introduced along with the oxygen gas. As stated above, passage of the $O_2/N_2$ gas mixture through the heated ceramic results in dissociation of the $O_2$ gas and the $N_2$ gas into atomic oxygen and atomic nitrogen, respectively, in accordance with the following:

$$O_2 \rightarrow O^- + O^-$$

$$N_2 \rightarrow N^- + N^-$$

The fast ramp furnace 22 also includes a port 28 for introducing the inert gas 30, e.g., Argon, into the vessel 22. The heating elements 24 are controlled to provided a temperature ramp rate of 100° C. per minute or greater.

Optionally, prior to the introduction of the $O_2$ gas (or $O_2/N_2$ mixture) into the reactor vessel 22, chlorine ($Cl_2$) gas 32 is introduced into the vessel 22 through the heated ceramic material 24, thereby generating atomic chlorine, which is used to preclean the surface of the silicon substrate 23 in the conventional manner prior to the oxidation step.

Figure 3:
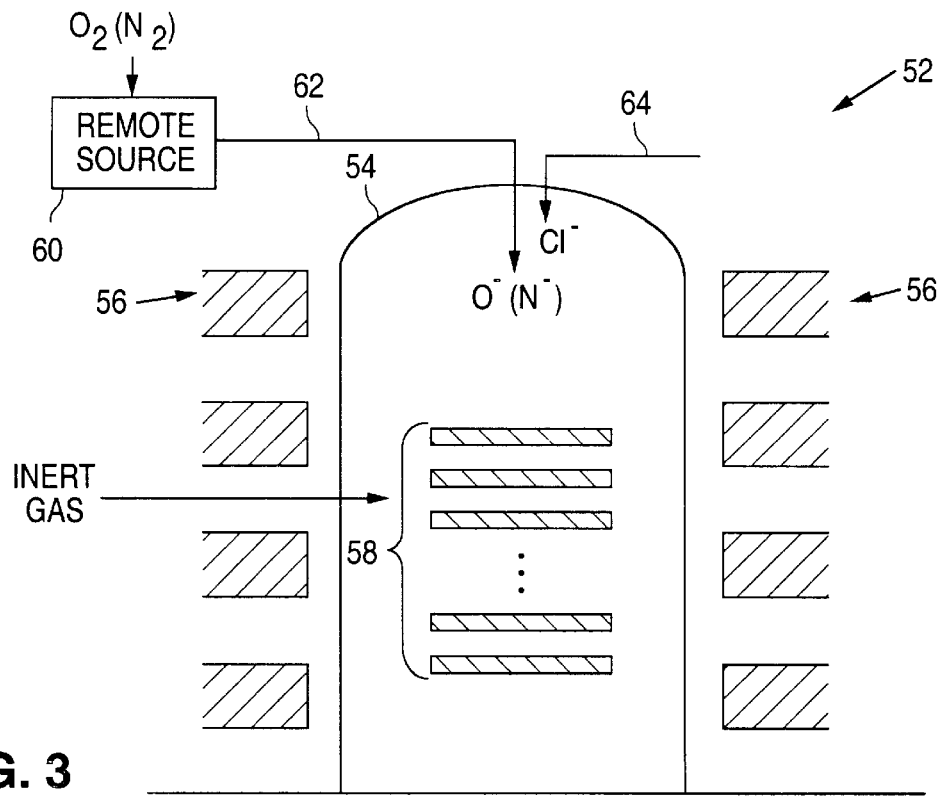
FIG. 3 is a schematic representation illustrating a furnace system utilizable in practicing an alternative method in accordance with the present invention.

FIG. 3 shows a system arrangement 50 for implementing an alternative embodiment of the invention. The alternative embodiment relies on a remote source of atomic oxygen, such as a conventional plasma generator.

As shown in FIG. 3, furnace 52 includes a reactor vessel 54 and controlled heating elements 56, as described above. As in the previous embodiment, the reactor vessel 54 is adapted to hold a plurality of wafers 58 having an exposed silicon surface. In this embodiment, however, rather than the atomic oxygen (or atomic oxygen plus atomic nitrogen) being generated within the reactor vessel 54, a remote source 60, e.g., a plasma reactor, generates a flow 62 of atomic oxygen (or $O^- + N^-$) which is provided to the vessel 54. The furnace heats the wafers 58 to a temperature suitable for reaction of the silicon and atomic oxygen (or $O^- + N^-$) to form silicon dioxide (or nitrogen-doped $SiO_2$).

Those skilled in the art will appreciate that the FIG. 3 embodiment of the invention can be supplemented with a source 64 of atomic chlorine, generated either remotely (e.g., chlorine plasma) or within the vessel 54 using a ceramic material in the manner described above in conjunction with the FIG. 2 embodiment of the invention.

Those skilled in the art will also appreciate that other well known techniques for remotely generating atomic oxygen, e.g., UV irradiation of $O_2$ gas, can be utilized in implementing this embodiment of the invention.

Figure 4:
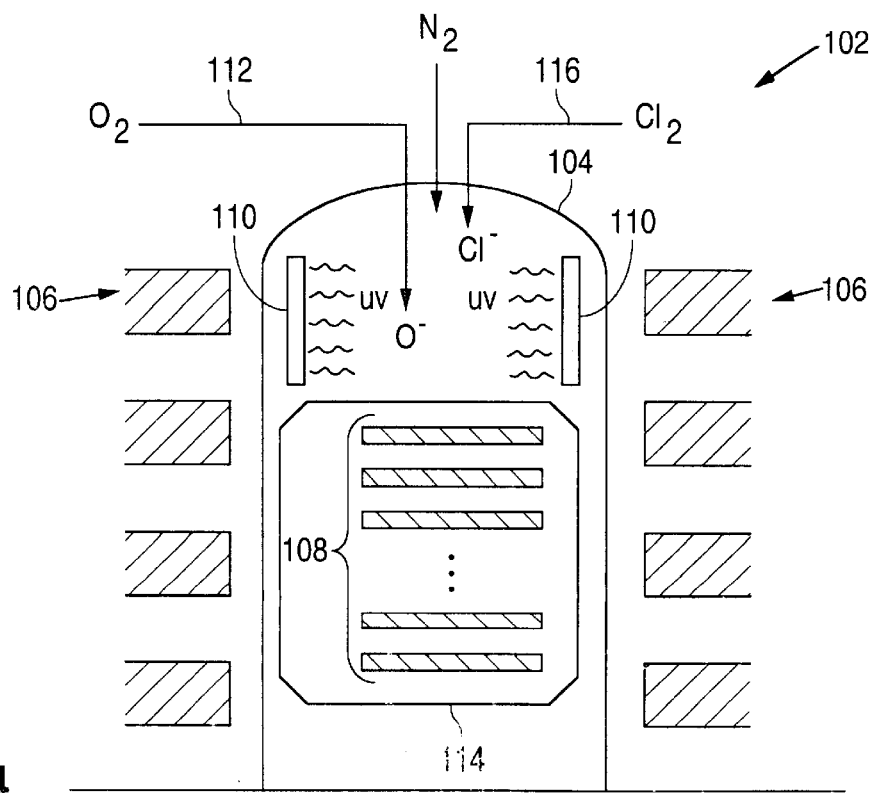
FIG. 4 is a schematic representation illustrating a furnace system utilizable in practicing a second alternative method in accordance with the present invention.

FIG. 4 shows a system arrangement 100 for implementing another alternative embodiment of the invention. This embodiment utilizes ultraviolet (UV) radiation for generating atomic oxygen (or atomic oxygen plus atomic nitrogen) within the reactor vessel 104.

As shown in FIG. 4, furnace 102 includes reactor vessel 104 and controlled heating elements 106. As in the previously-described embodiments, the reactor vessel 104 is adapted to hold a plurality of wafers 108 having an exposed silicon surface. Unlike the previous embodiments, however, the reactor vessel 104 in this embodiment includes a UV radiation source 110 that is utilized to generate atomic oxygen (or $O^- + N^-$) from an incoming stream 112 of oxygen gas (or $O_2/N_2$ gas mixture). Note that, in this embodiment of the invention, the wafers 108 are protected from the UV radiation by a UV shield 114.

Those skilled in the art will appreciate that the FIG. 4 embodiment of the invention can also be supplemented with a source 116 of atomic chlorine for pre-cleaning the silicon surface, as discussed above in conjunction with the FIG. 2 and FIG. 3 embodiments.

As discussed above, any of the previously-described systems can be used to generate atomic oxygen in combination with atomic nitrogen, either internally or remotely, to form a nitrogen-doped silicon dioxide layer on the silicon. For example, NO, $N_2O$, $NO + O_2$, or $N_2 + O_2$ can be used as the initial gas chemistry for generating the nitride-containing silicon dioxide.

Nitride-containing silicon dioxide has been found to be particularly useful as the gate dielectric material in MOS device structures to insulate a doped polysilicon gate from the silicon substrate channel region. That is, nitrogen doping of $SiO_2$ inhibits dopant diffusion from the poly gate.

It should be understood that various alternatives to the several embodiments of the invention described above may be employed in practicing the invention. It is intended that the following claims define the scope of the invention and that methods within the scope of these claims and their equivalents be covered thereby.

What is claimed is:

1. A method of thermally oxidizing silicon to form a layer of silicon dioxide on a surface of the silicon, the method comprising:
   placing the silicon and a ceramic material in a furnace;
   passing oxygen gas through the ceramic material to generate atomic oxygen,
   introducing the atomic oxygen to the surface of the silicon; and
   heating the silicon surface such that the silicon reacts with the atomic oxygen to form the layer of silicon dioxide on the surface of the silicon.

2. A method as in claim 1, and wherein the step of introducing atomic oxygen includes simultaneously introducing atomic nitrogen such that the heating step results in formation of a layer of nitrogen-containing silicon dioxide on the surface of the silicon.

3. A method as in claim 1, and wherein the atomic oxygen is generated within the furnace.

4. A method as in claim 1, and wherein the atomic oxygen is generated outside the furnace and provided to the interior of the furnace for introduction to the surface of the silicon.

5. A method as in claim 1, and wherein the surface of the silicon is pre-cleaned using atomic chlorine prior to introducing the atomic oxygen to the surface of the silicon.

6. A method of thermally oxidizing silicon to form a layer of silicon dioxide on a surface of the silicon, the method comprising:
   placing the silicon and a ceramic material in a furnace;
   introducing an inert gas into the furnace;
   pre-heating the surface of the silicon to a first temperature in the presence of the inert gas such that the presence of the inert gas substantially inhibits oxidation of the silicon surface during the pre-heating step;
   passing oxygen gas through the ceramic material, and simultaneously heating the ceramic material to a second temperature that is greater than the first temperature such that the passing of the oxygen gas through the heated ceramic material generates atomic oxygen that reacts with the silicon to form the layer of silicon dioxide on the surface of the silicon.

7. A method as in claim 6, and wherein the step of passing oxygen gas through the ceramic material includes simultaneously passing nitrogen gas through the ceramic material to generate atomic nitrogen thereby resulting in formation of a layer of nitrogen-containing silicon dioxide on the surface of the silicon.

8. A method as in claim 6, and wherein the inert gas is argon.

9. A method as in claim 6, and wherein the ceramic material comprises aluminum oxide.

10. A method as in claim 9, and wherein the first temperature is about 500° C.

11. A method as in claim 10, and wherein the second temperature is about 1000° C.

12. A method of thermally oxidizing a silicon substrate to form a layer of silicon dioxide on the surface of the silicon substrate, the method comprising:

placing the silicon substrate and ceramic material in a fast ramp furnace;

introducing an inert gas into the fast ramp furnace;

pre-heating the silicon substrate to a first temperature in the presence of the inert gas such that the presence of the inert gas substantially inhibits oxidation of the silicon substrate during the pre-heating step;

passing chlorine gas through the ceramic material such that the chlorine gas dissociates to generate atomic chlorine for pre-cleaning the surface of the silicon substrate;

removing chlorine constituents from the fast ramp furnace;

passing oxygen gas through the ceramic material, and simultaneously heating the ceramic material to a second temperature that is greater than the first temperature such that the passing of the oxygen gas through the heated ceramic material generates atomic oxygen that reacts with the silicon substrate to form the layer of silicon dioxide on the surface of the silicon substrate.

13. A method as in claim 12, and wherein the ceramic material is selected from the group consisting of $Al_2O_3$, $ZrO_2$, and $Y_2O_3$.

14. A material as in claim 12, and wherein the inert gas comprises argon.

* * * * *